US012262587B2

(12) United States Patent
Yang et al.

(10) Patent No.: US 12,262,587 B2
(45) Date of Patent: Mar. 25, 2025

(54) HEAT DISSIPATION FILM FOR DISPLAY MODULE, AND PREPARATION METHOD OF DISPLAY DEVICE

(71) Applicants: Chengdu BOE Optoelectronics Technology Co., Ltd., Sichuan (CN); BOE Technology Group Co., Ltd., Beijing (CN)

(72) Inventors: Enjian Yang, Beijing (CN); Hao Sun, Beijing (CN); Liang Gao, Beijing (CN); Ajuan Du, Beijing (CN); Xing Peng, Beijing (CN); Shuang Zhang, Beijing (CN); Dong Wang, Beijing (CN); Bin Wang, Beijing (CN); Feifan Li, Beijing (CN); Hufei Yang, Beijing (CN); Xiaoxia Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 539 days.

(21) Appl. No.: 17/770,639

(22) PCT Filed: Jul. 7, 2021

(86) PCT No.: PCT/CN2021/104912
§ 371 (c)(1),
(2) Date: Apr. 21, 2022

(87) PCT Pub. No.: WO2022/042060
PCT Pub. Date: Mar. 3, 2022

(65) Prior Publication Data
US 2022/0376202 A1    Nov. 24, 2022

(30) Foreign Application Priority Data
Aug. 27, 2020    (CN) .......................... 202010876839.7

(51) Int. Cl.
*H01L 51/52*    (2006.01)
*H05K 7/20*    (2006.01)
(Continued)

(52) U.S. Cl.
CPC .......... *H10K 50/87* (2023.02); *H05K 7/20954* (2013.01); *H10K 50/865* (2023.02); *H10K 71/00* (2023.02)

(58) Field of Classification Search
CPC ...... H10K 50/87; H10K 50/865; H10K 71/00; H10K 59/8794; H05K 7/20954;
(Continued)

(56) References Cited

U.S. PATENT DOCUMENTS

2003/0148021 A1    8/2003    Ishizuka
2013/0280463 A1    10/2013    On et al.
(Continued)

FOREIGN PATENT DOCUMENTS

| CN | 204906959 U | 12/2015 |
| CN | 105467649 A | 4/2016 |

(Continued)

OTHER PUBLICATIONS

International Search Report for PCT/CN2021/104912 Mailed Sep. 28, 2021.
(Continued)

*Primary Examiner* — Jarrett J Stark
(74) *Attorney, Agent, or Firm* — Ling Wu; Stephen Yang; Ling and Yang Intellectual Property

(57) ABSTRACT

A heat dissipation film for a display module, and a preparation method of a display device. The heat dissipation film comprises a composite structure layer and a removable protective film disposed on the composite structure layer. The composite structure layer has a first side surface and a second side surface disposed opposite to each other, and is (Continued)

provided with a preconfigured hole passing through the first side surface and the second side surface. The first side surface of the composite structure layer adheres to a side of the display module facing away from a display side. The protective film is attached to the second side surface of the composite structure layer. The protective film is provided with a shielding region covering the preconfigured hole. The shielding region and the rest of the protective film can all be independently torn off from the composite structure layer.

20 Claims, 3 Drawing Sheets

(51) Int. Cl.
  *H10K 50/86* (2023.01)
  *H10K 50/87* (2023.01)
  *H10K 71/00* (2023.01)
(58) Field of Classification Search
  CPC ............ H05K 7/20963; B32B 2307/30; B32B 2457/20; B32B 3/266; B32B 5/18; B32B 7/12; B32B 27/065; B32B 27/281; B32B 27/36; B32B 33/00; H04M 1/0266
  See application file for complete search history.

(56) References Cited

U.S. PATENT DOCUMENTS

| | | | |
|---|---|---|---|
| 2019/0073505 A1 | 3/2019 | Kwon et al. | |
| 2019/0244002 A1* | 8/2019 | Ye | H10K 59/12 |
| 2019/0272407 A1* | 9/2019 | Park | G06V 40/1329 |
| 2019/0306986 A1* | 10/2019 | Lee | H05K 1/183 |
| 2020/0057467 A1* | 2/2020 | Kim | G06F 1/1626 |
| 2021/0210568 A1 | 7/2021 | Huang et al. | |
| 2023/0354683 A1* | 11/2023 | Yang | B32B 33/00 |

FOREIGN PATENT DOCUMENTS

| | | | | |
|---|---|---|---|---|
| CN | 205176439 U | | 4/2016 | |
| CN | 105785625 A | | 7/2016 | |
| CN | 205453823 U | | 8/2016 | |
| CN | 105974623 A | | 9/2016 | |
| CN | 108630815 A | | 10/2018 | |
| CN | 109037474 A | | 12/2018 | |
| CN | 109284716 A | | 1/2019 | |
| CN | 109354493 A | | 2/2019 | |
| CN | 109427853 A | | 3/2019 | |
| CN | 110305599 A | | 10/2019 | |
| CN | 111556701 A | | 8/2020 | |
| CN | 211238260 U | | 8/2020 | |
| CN | 111787771 A | * | 10/2020 | ............... G09F 9/33 |
| CN | 111867342 A | | 10/2020 | |
| CN | 212413693 U | | 1/2021 | |
| CN | 117202729 A | * | 12/2023 | |
| CN | 117831084 A | * | 4/2024 | |
| KR | 20190053367 A | * | 5/2019 | ........... G06K 9/0004 |
| KR | 1020190053367 A | | 5/2019 | |
| WO | WO-2021168633 A1 | * | 9/2021 | |
| WO | WO-2021230657 A1 | * | 11/2021 | ............. G06F 3/041 |
| WO | WO-2022047801 A1 | * | 3/2022 | ......... H05K 7/20963 |
| WO | WO-2022105481 A1 | * | 5/2022 | ........... B32B 27/065 |

OTHER PUBLICATIONS

Office Action dated Oct. 31, 2023 for Chinese Patent Application No. 202010876839.7 and English Translation.

* cited by examiner

HEAT DISSIPATION FILM FOR DISPLAY MODULE, AND PREPARATION METHOD OF DISPLAY DEVICE

CROSS-REFERENCE TO RELATED APPLICATIONS

The present application is a U.S. National Phase Entry of International Application PCT/CN2021/104912 having an international filing date of Jul. 7, 2021, which claims priority of Chinese Patent Application No. 202010876839.7, entitled "Heat Dissipation Film for Display Module, and Preparation Method of Display Device" and filed to the CNIPA on Aug. 27, 2020, the contents disclosed in the above-mentioned applications are hereby incorporated as a part of this application.

TECHNICAL FIELD

Embodiments of the present disclosure relate to, but are not limited to, the technical field of display devices, in particular to a heat dissipation film for display module, and a preparation method of display device.

BACKGROUND

Organic light emitting diode (OLED) display devices are more and more widely applied. Some sensor modules (such as a module for fingerprint unlocking, a module for turning off screen when close to face, etc.) in a display module are disposed on a back side of a display panel, and the back side of the display panel is usually attached with a heat dissipation film. These sensor modules are usually installed after the heat dissipation film is attached, and therefore it is necessary to reserve corresponding holes in the heat dissipation film for installation of these sensor modules. After some display modules are attached to the heat dissipation film, a position of the display panel corresponding to a reserved hole on the heat dissipation film may encounter a stamping problem, which would affect display effects.

SUMMARY

The following is a summary of subject matters described in the present disclosure in detail. The summary is not intended to limit the scope of protection of claims.

An embodiment of the present disclosure provides a heat dissipation film for a display module, including a composite structure layer and a removable protective film disposed on the composite structure layer, the composite structure layer has a first side surface and a second side surface disposed opposite to each other and is provided with a reserved hole penetrating through the first side surface and the second side surface, the first side surface of the composite structure layer is configured to be adhered to a side of the display module facing away from a display side, the protective film is attached to the second side surface of the composite structure layer; the protective film is provided with a shielding region covering the reserved hole, the shielding region and the rest of the protective film can be independently torn off from the composite structure layer, the shielding region is provided with a cut-off line and the cut-off line communicates inside of the reserved hole with a side of the protective film facing away from the composite structure layer.

An embodiment of the present disclosure further provides a method for preparing a display device, which includes: attaching the heat dissipation film to the side of the display module facing away from the display side, and aligning the reserved hole with a set region of the display module, wherein, after attaching the heat dissipation film to the display module, the cut-off line enables the internal air pressure of the reserved hole to be equal to an external air pressure.

Other aspects may be understood upon reading and understanding of the drawings and the detailed description.

DESCRIPTION OF DRAWINGS

Accompanying drawings are used to provide an understanding of embodiments of the present disclosure, form a part of the specification, and are used to explain technical solutions of the embodiments of the present disclosure together with the embodiments of the present disclosure, but are not intended to form limitations on the technical solutions of the embodiments of the present disclosure.

DETAILED DESCRIPTION

Those of ordinary skills in the art should understand that modifications or equivalent replacements may be made to the technical solutions of the embodiments of the disclosure without departing from the spirit and scope of the technical solutions of the disclosure, and shall all fall within the scope of the claims of the disclosure.

Figure 1:
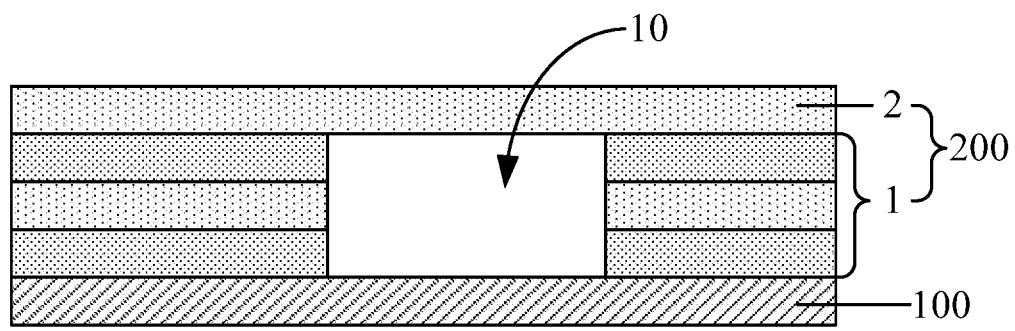
FIG. 1 is a schematic diagram of a sectional structure of some display modules after being attached with a heat dissipation film.
Figure 2:
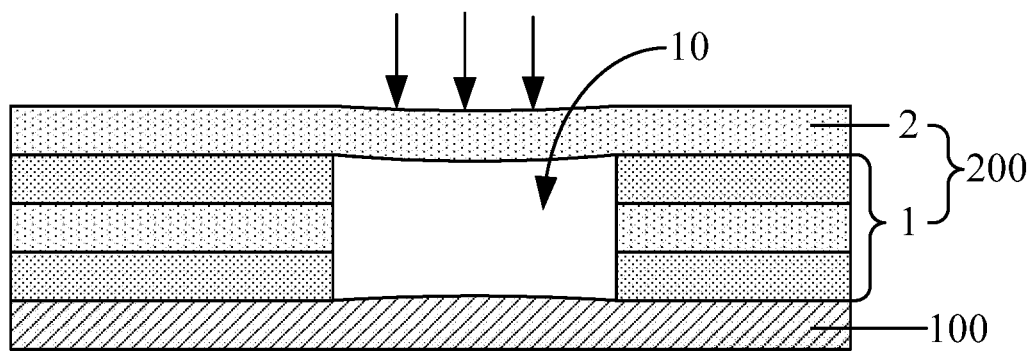
FIG. 2 is a schematic structural diagram of the display module of FIG. 1 producing a stamping after being attached with a heat dissipation film.

As shown in FIG. 1, after some display modules 100 are attached to a heat dissipation film 200 (the heat dissipation film 200 includes a composite structure layer 1 and a protective film 2 disposed on the composite structure layer 1, wherein the composite structure layer 1 is provided with a reserved hole 10), the reserved hole 10 forms an enclosed space together with the display module 100 and the protective film 2. During an attaching of the heat dissipation film 200 (roller pressing may be used for the attaching), part of gas in the reserved hole 10 is discharged, and each film layer of the heat dissipation film 200 is squeezed and deformed during the attaching. After the attaching is completed for a certain time, the deformation of each film layer of the heat dissipation film 200 is restored, and the enclosed space enlarges, causing an air pressure in the enclosed space to decrease. At this point, as shown in FIG. 2, the air pressure in the enclosed space is lower than an external atmospheric pressure, therefore, the external atmospheric pressure (three parallel lines with arrows in FIG. 2 represent the external atmospheric pressure) exerts a certain pressure on the protective film 2, and a part of the protective film 2 covering the reserved hole 10 has apparent dents. Since the protective film 2 and the composite structure layer 1 of the heat dissipation film 200 are adhered together, each film layer of the heat dissipation film around the enclosed space is forced to deform and squeeze the display module 100, thereby causing a stamping problem to the display module 100 and causing a position of a display panel of the display module 100 corresponding to the reserved hole 10 to bulge.

Figure 3A:
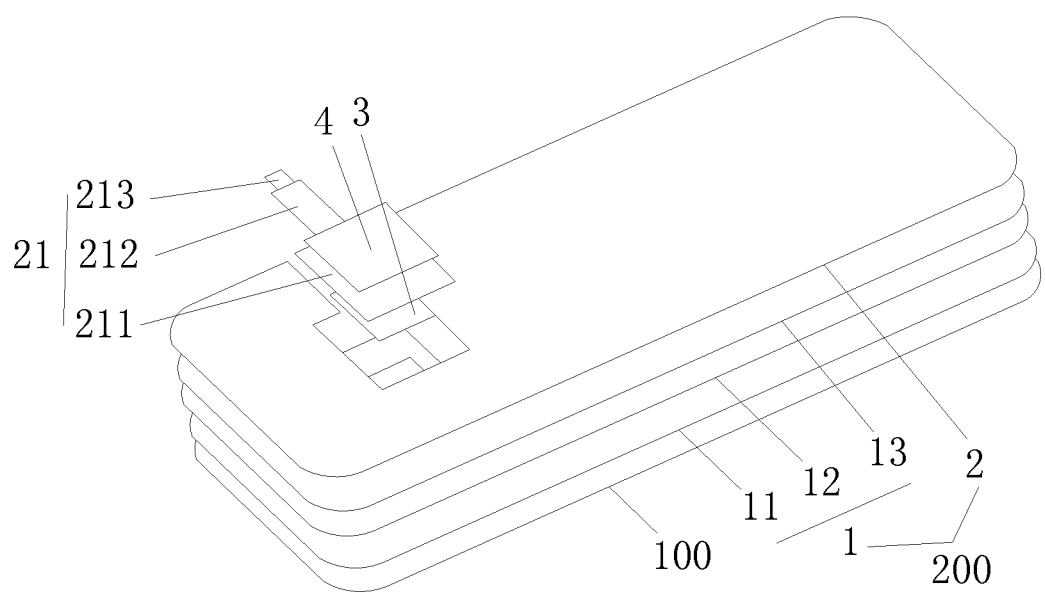
FIG. 3a is a schematic exploded view of a structure of a heat dissipation film according to some exemplary embodiments.
Figure 4:
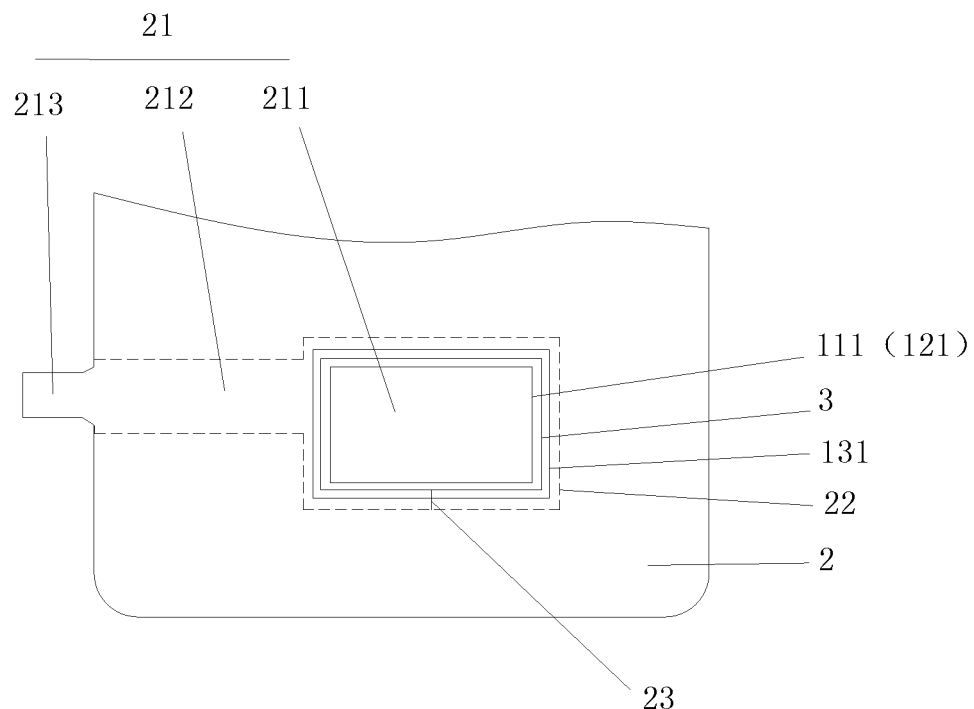
FIG. 4 is a schematic top view of a structure of a heat dissipation film according to some exemplary embodiments.
Figure 5:
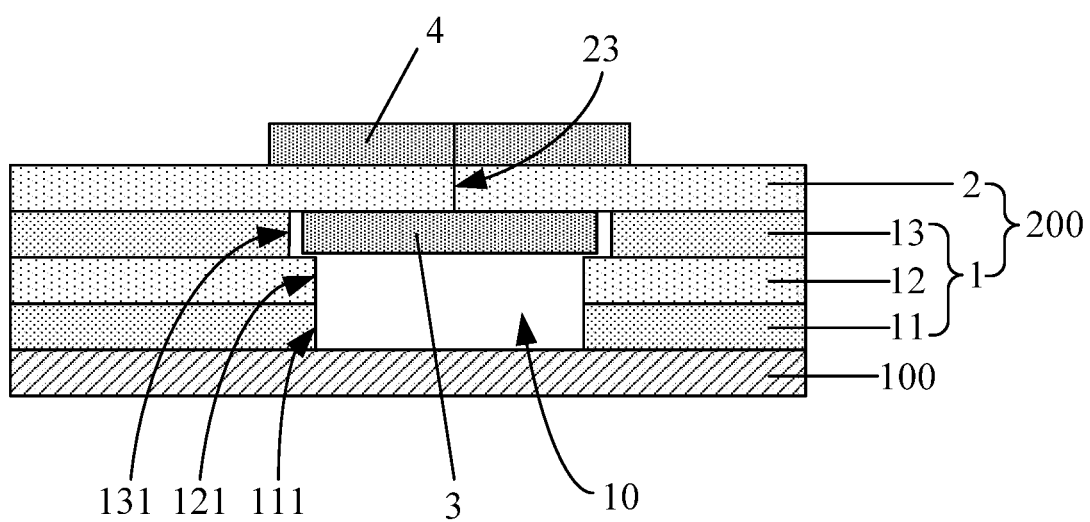
FIG. 5 is a schematic diagram of a sectional structure of a heat dissipation film after being attached to a display module according to some exemplary embodiments.

As shown in FIG. 3a, FIG. 4 and FIG. 5, an embodiment of the present disclosure provides a heat dissipation film for a display module, wherein the heat dissipation film 200 includes a composite structure layer 1 and a removable protective film 2 disposed on the composite structure layer 1. The composite structure layer 1 has a first side surface and a second side surface disposed opposite to each other and the composite structure layer 1 is provided with a reserved hole 10 penetrating through the first side surface and the second side surface. The first side surface of the composite structure layer 1 is configured to be adhered to a side of the display module 100 facing away from a display side, and the protective film 2 is attached to the second side surface of the composite structure layer 1. The protective film 2 is provided with a shielding region 21 covering the reserved hole 10, wherein both the shielding region 21 and the rest of the protective film 2 can be independently torn off from the composite structure layer 1. The shielding region 21 is provided with a cut-off line 23, wherein the cut-off line 23 communicates the inside of the reserved hole 10 with a side of the protective film 2 facing away from the composite structure layer 1.

In the heat dissipation film for the display module according to the embodiment of the present disclosure, the cut-off line 23 is provided on the protective film 2, and the cut-off line 23 communicates the inside of the reserved hole 10 of the composite structure layer 1 with the side of the protective film 2 facing away from the composite structure layer 1. Thus, after the heat dissipation film 200 is attached to the display module 100, outside air can enter the reserved hole 10 from the cut-off line 23, so that an air pressure inside the reserved hole 10 is the same as the external air pressure, thus avoiding the stamping problem caused by the difference between the internal air pressure in the reserved hole 10 and the external air pressure, and improving the product yield.

The heat dissipation film 200 of according to embodiment of the present disclosure may be used for a rigid or flexible OLED display module, which may include an OLED display panel, a touch structure layer, a polarizer, a cover plate, a flexible circuit board, and the like. The heat dissipation film 200 is attached to a side of the OLED display panel facing away from the display side, which can serve to dissipate heat, facilitate rapid dissipation of heat generated during operation of the OLED display panel, and also play a role in light shading. The reserved hole 10 in the heat dissipation film 200 may be configured for installation of some sensor modules, such as a module for fingerprint unlocking, a module for turning off screen when close to face, etc. When installing these sensor modules, the protective film 2 of the heat dissipation film 200 may be torn off by hand or by a tool.

As shown in FIG. 4, in some exemplary embodiments, the protective film 2 is further provided with a partition line 22 separating the shielding region 21 from the rest of the protective film 2. Exemplarily, the partition line 22 may completely cut the shielding region 21 from the rest of the protective film 2, so that the shielding region 21 is not connected to the rest of the protective film 2. Alternatively, the partition line 22 may include multiple pores discontinuously arranged, so that it is easy to completely separate the shielding region 21 from the rest of the protective film 2 along the partition line 22 under the action of an external force. Thus, both the shielding region 21 and the rest of the protective film 2 can be independently torn off from the composite structure layer 1 by the partition line 22. After the rest of the protective film 2 is torn off from the composite structure layer 1, the shielding region 21 is still covered on the reserved hole 10, and the shielding region 21 can protect a portion of the display module 100 exposed by the reserved hole 10.

As shown in FIG. 4, in some exemplary embodiments, the partition line 22 may extend to an edge of the protective film 2. The shielding region 21 may include a first region 211 completely covering the reserved hole 10, and a second region 212 connected to a side of the first region 211. One end of the second region 212 away from the first region 211 extends to the edge of the protective film 2, and is provided with a protruding part 213 protruding from the edge of the protective film 2. In an example of this embodiment, a shape of the first region 211 may match a cross-sectional shape of the reserved hole 10. For example, the cross-sectional shape of the reserved hole 10 may be rectangular, circular, polygonal, etc., and accordingly, the shape of the first region 211 is rectangular, circular, polygonal, etc. An area of the first region 211 is larger than a cross-sectional area of the reserved hole 10. A shape of the second region 212 may be strip-shaped. One end of the second region 212 is in contact with the first region 211, and the other end of the second region 212 is provided with a protruding part 213. When the shielding region 21 is being torn off, the protruding part 213 can be clamped for tearing off the shielding region 21 from the composite structure layer 1.

As shown in FIG. 4, in some exemplary embodiments, the first region 211 is provided with the cut-off line 23, wherein one end of the cut-off line 23 may extend to the partition line 22, and the other end of the cut-off line 23 may be located in the middle of the shielding region 21. The number of the cut-off line(s) 23 may be one or more.

As shown in FIGS. 3a and 5, in some exemplary embodiments, the heat dissipation film 200 may further include a support sheet 3, wherein the support sheet 3 is provided on a portion of the protective film 2 facing into the reserved hole 10, and a thickness of the support sheet 3 is less than a depth of the reserved hole 10. In an example of this embodiment, the support sheet 3 may be supported on the display module 100 during the attaching of the heat dissipation film 200 to the display module 100, and therefore, damages to the display module 100 caused by a high segment difference of the heat dissipation film 200 at the reserved hole 10 may be prevented. In addition, since a side of the protective film 2 facing the composite structure layer 1 is adhesive, arrangement of the support sheet 3 can prevent the protective film 2 from being adhered to the display module 100 during the attaching of the heat dissipation film 200 to the display module 100. The support sheet 3 may not be cut to the cut-off line 23, and the support sheet 3 does not shield the cut-off line 23, so as to ensure that external gas can enter the reserved hole 10 through the cut-off line 23.

As shown in FIG. 5, in some exemplary embodiments, the composite structure layer 1 may include an adhesive layer 11, a buffer layer 12, and a metal layer 13 which are sequentially stacked. The protective film 2 is attached to the metal layer 13, and the adhesive layer 11 is configured to be adhered to a side of the display module 100 facing away from the display side. In an example of this embodiment, the heat dissipation film 200 may be Super Clean Foam (SCF for short). The adhesive layer 11 may be a reticulated adhesive (EMBO) layer, and vertical and horizontal reticulated patterns may be printed on the adhesive surface by mesh pressure, so as to prevent curling caused by shrinkage of the adhesive layer and strengthen the close attaching between the heat dissipation film 200 and the display module 100. An adhesive material of the adhesive layer 11 may be acrylic or silica gel. A material of the buffer layer 12 may be Foam, and the buffer layer 12 can buffer external forces to prevent the display panel from being damaged by the attaching pressure during the attaching of the heat dissipation film 200 and the display module 100. A material of the metal layer 13 may be copper or aluminum or the like, to impart good heat dissipation effect to the heat dissipation film 200.

As shown in FIGS. 4 and 5, in some exemplary embodiments, the adhesive layer 11, the buffer layer 12 and the metal layer 13 are respectively provided with a first opening 111, a second opening 121 and a third opening 131. The first opening 111, the second opening 121 and the third opening 131 form the reserved hole 10. An orthographic projection of the third opening 131 on the protective film 2 may cover an orthographic projection of the second opening 121 on the protective film 2, and the orthographic projection of the second opening 121 on the protective film 2 may cover or coincide with an orthographic projection of the first opening 111 on the protective film 2. In this example, openings of different sizes are provided on each layer of the composite structure layer 1, so that the height segment difference of the reserved hole 10 formed on the composite structure layer 1 is not excessively large, thereby avoiding damages to the display panel caused by the large height segment difference at the reserved hole 10 during the attaching of the heat dissipation film 200 and the display module 100. In this example, shapes of the first opening 111, the second opening 121 and the third opening 131 are matched with each other. For example, all of the openings are rectangular, circular or polygonal. The shielding region 21 of the protective film 2 may completely cover the third opening 131, so that the shielding region 21 may completely cover the reserved hole 10. In other examples, the shapes and sizes of the first opening 111, the second opening 121 and the third opening 131 may all be the same.

As shown in FIGS. 4 and 5, in some exemplary embodiments, a thickness of the support sheet 3 is less than or equal to a thickness of the metal layer 13, and an orthographic projection of the support sheet 3 on the protective film 2 covers the orthographic projection of the second opening 121 on the protective film 2. In an example of this embodiment, there is a gap between an edge of the support sheet 3 and a hole wall of the third opening 131, which may for example be a gap of 0.2 mm to 0.4 mm. The cut-off line 23 is provided at least partially in a region of the shielding region 21 corresponding to this gap. One end of the cut-off line 23 may extend to the partition line 22, and the other end of the cut-off line 23 may extend to a position of the shielding region 21 corresponding to the edge of the support sheet 3. The cut-off line 23 may not be cut to the support sheet 3. In this example, during the attaching of the heat dissipation film 200 to the display module 100, an edge portion of the support sheet 3 may be supported on the buffer layer 12, and therefore, the attaching pressure would be dispersed to the buffer layer 12 and the adhesive layer 11, thereby preventing damages to the display module 100.

In some exemplary embodiments, a side of the support sheet 3 is adhered to a portion of the protective film 2 facing into the reserved hole 10, and the other side of the support sheet 3 may be coated with silicone oil. The silicone oil may serve a non-hydrophilic and non-lipophilic function. Since a side of the buffer layer 12 facing the protective film 2 is adhesive and the side of the support sheet 3 is coated with silicone oil, the support sheet 3 can be prevented from adhering to the buffer layer 12 during the attaching of the heat dissipation film 200 and the display module 100.

The support sheet 3 may be made of a flexible material and opaque to light. The support sheet 3 made of the flexible material can prevent damages to the display module 100. The support sheet 3 may be black for playing a role in light shading. Exemplarily, a material of the support sheet 3 may be polyethylene terephthalate (PET), polyethylene (PE), polyimide (PI), and the like.

Figure 3B:
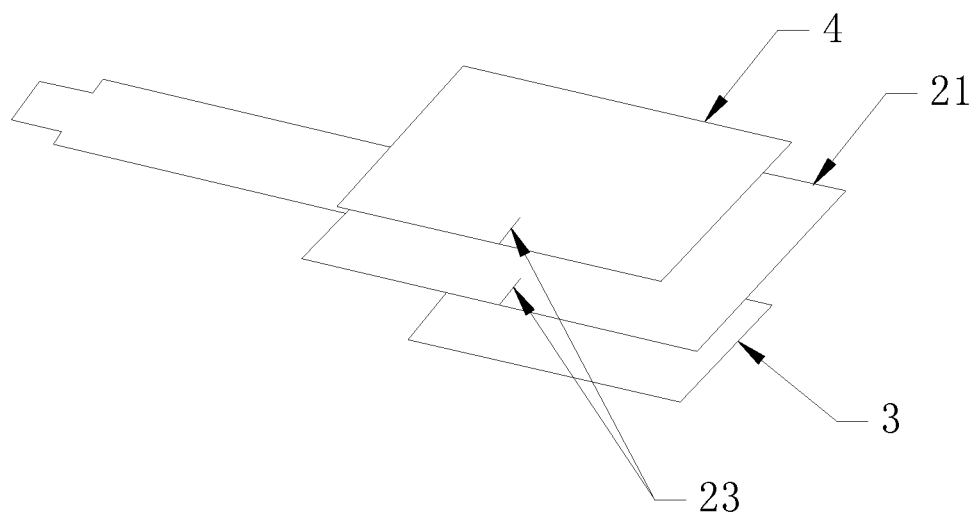
FIG. 3b is a schematic exploded view of a structure of a portion where a shielding region of the heat dissipation film in FIG. 3a is located.

As shown in FIGS. 3b and 5, in some exemplary embodiments, the heat dissipation film 200 may further include a light shielding sheet 4. The light shielding sheet 4 is attached to a side of the shielding region 21 facing away from the composite structure layer 1, and a position of the light shielding sheet 4 corresponding to the cut-off line 23 is cut by the cut-off line 23. Exemplarily, the light shielding sheet 4 may be a black light shielding tape and be attached to the protective film 2, and the light shielding sheet 4 may completely cover the reserved hole 10. The protective film 2 may be made of a translucent material. The light shielding sheet 4 may prevent external light from passing through the protective film 2 and irradiating on the display module 100 exposed by the reserved hole 10. In this example, when the cut-off line 23 on the protective film 2 is formed, the light shielding sheet 4 may also be cut at the same time, so that the cut-off line 23 is formed also at a corresponding position of the light shielding sheet 4 at the same time, which prevents the light shielding sheet 4 from blocking the cut-off line 23 on the protective film 2 and then affecting balance between the internal air pressure of the reserved hole 10 and the external air pressure after the heat dissipation film 200 and the display module 100 are attached.

As shown in FIG. 5, an embodiment of the present disclosure further provides a method for preparing a display device, which includes: attaching the heat dissipation film 200 described in any one of the above embodiments to a side of the display module 100 facing away from the display side, and aligning the reserved hole 10 with a set region of the display module 100, wherein, after attaching the heat dissipation film 200 to the display module 100, the cut-off line 23 enables the internal air pressure of the reserved hole 10 to be equal to the external air pressure.

In the method for preparing the display device according to embodiment of the present disclosure, during the attaching (roller pressing may be used for the attaching) of the heat dissipation film 200, when the attaching roller(s) pass the reserved hole 10, part of the gas inside the reserved hole 10 is discharged, and at the same time, each film layer of the heat dissipation film 200 is deformed under pressure. After the attaching is completed for a certain time, the deformation of each film layer of the heat dissipation film 200 is restored, and the internal space of the reserved hole 10 is enlarged. At this point, according to the principle of pressure difference, external gas enters the reserved hole 10 from the cut-off line 23, and finally the air pressures inside and outside the reserved hole 10 are the same, thus avoiding the occurrence of stamping of the display module 100.

In some exemplary embodiments, as shown in FIG. 4, the method for preparing display device further includes: after attaching the heat dissipation film 200 to the display module 100, tearing off a portion of the protective film 2 other than the shielding region 21, and cleaning the second side surface of the composite structure layer 1; and tear off the shielding region 21 and installing a sensor module in the reserved hole 10.

In an example of this embodiment, the second side surface of the composite structure layer 1 may be cleaned with a plasma cleaning apparatus. Since the shielding region 21 still covers the reserved hole 10 during the cleaning process, the shielding region 21 can prevent plasma from causing damages to the portion of the display module 100 exposed by the reserved hole 10.

The display module 100 according to embodiments of the present disclosure may be a rigid or flexible OLED display module, wherein the OLED display module may include an OLED display panel, a touch structure layer, a polarizer, a cover plate, a flexible circuit board, and the like. The heat dissipation film 200 is attached to the side of the OLED display panel facing away from the display side, which can serve to dissipate heat. The sensor module may be a module for fingerprint unlocking, a module for turning off screen when close to face, etc.

In the description of the embodiments of the disclosure, terms "connection", "fixed connection", "installation" and "assembly" are to be understood in a broad sense, for example, a connection may be a fixed connection, or a detachable connection, or may be an integral connection, unless explicitly specified and defined otherwise. The terms "installation", "connection" and "fixed connection" may refer to a direct connection, or may an indirect connection through an intermediate medium, or may be an internal connection between two elements. Those of ordinary skills in the art can understand the specific meanings of the above mentioned terms in the present disclosure according to specific context.

The invention claimed is:

1. A heat dissipation film for a display module, comprising a composite structure layer and a removable protective film disposed on the composite structure layer, wherein the composite structure layer has a first side surface and a second side surface disposed opposite to each other, and is provided with a reserved hole penetrating through the first side surface and the second side surface, the first side surface of the composite structure layer is configured to be adhered to a side of the display module facing away from a display side, and the protective film is attached to the second side surface of the composite structure layer;

the protective film is provided with a shielding region covering the reserved hole, the shielding region and the rest of the protective film is can be independently torn off from the composite structure layer, the shielding region is provided with a cut-off line, and the cut-off line communicates inside of the reserved hole with a side of the protective film facing away from the composite structure layer.

2. The heat dissipation film for the display module according to claim 1, wherein the protective film is further provided with a partition line separating the shielding region from the rest of the protective film.

3. The heat dissipation film for the display module according to claim 2, wherein one end of the cut-off line extends to the partition line.

4. The heat dissipation film for the display module according to claim 1, wherein the shielding region comprises a first region completely covering the reserved hole, and a second region connected to a side of the first region; one end of the second region facing away from the first region extends to an edge of the protective film, and is provided with a protruding part protruding from the edge of the protective film.

5. The heat dissipation film for the display module according to claim 1, further comprising a support sheet, wherein the support sheet is provided on a part of the protective film facing into the reserved hole, and a thickness of the support sheet is less than a depth of the reserved hole.

6. The heat dissipation film for the display module according to claim 5, wherein the support sheet is made of a flexible material and is opaque to light.

7. The heat dissipation film for the display module according to claim 5, wherein the composite structure layer comprises an adhesive layer, a buffer layer, and a metal layer which are sequentially stacked; the protective film is attached to the metal layer, and the adhesive layer is configured to be adhered to the side of the display module facing away from the display side.

8. The heat dissipation film for the display module according to claim 7, wherein the adhesive layer, the buffer layer and the metal layer are respectively provided with a first opening, a second opening and a third opening; the first opening, the second opening and the third opening form the reserved hole; an orthographic projection of the third opening on the protective film covers an orthographic projection of the second opening on the protective film, and the orthographic projection of the second opening on the protective film covers or coincide with an orthographic projection of the first opening on the protective film.

9. The heat dissipation film for the display module according to claim 8, wherein the shielding region completely covers the third opening; a thickness of the support sheet is less than or equal to a thickness of the metal layer, and an orthographic projection of the support sheet on the protective film covers the orthographic projection of the second opening on the protective film.

10. The heat dissipation film for the display module of claim 7, wherein a material of the buffer layer comprises foam and a material of the metal layer comprises copper.

11. The heat dissipation film for the display module according to claim 1, further comprising a light shielding sheet, wherein the light shielding sheet is attached to a side of the shielding region facing away from the composite structure layer, and a position of the light shielding sheet corresponding to the cut-off line is cut by the cut-off line.

12. A method for preparing a display device, comprising:
attaching the heat dissipation film according to claim 1 to the side of the display module facing away from the display side, and aligning the reserved hole with a set region of the display module, wherein, after attaching the heat dissipation film to the display module, the cut-off line enables internal air pressure of the reserved hole to be equal to an external air pressure.

13. The method for preparing the display device according to claim 12, further comprising: after the heat dissipation film is attached to the display module,
tearing off a portion of the protective film other than the shielding region, and cleaning the second side surface of the composite structure layer; and
tear off the shielding region and installing a sensor module in the reserved hole.

14. A method for preparing a display device, comprising:
attaching the heat dissipation film according to claim 2 to the side of the display module facing away from the display side, and aligning the reserved hole with a set region of the display module, wherein, after attaching the heat dissipation film to the display module, the cut-off line enables internal air pressure of the reserved hole to be equal to an external air pressure.

15. A method for preparing a display device, comprising:
attaching the heat dissipation film according to claim 3 to the side of the display module facing away from the display side, and aligning the reserved hole with a set region of the display module, wherein, after attaching the heat dissipation film to the display module, the cut-off line enables internal air pressure of the reserved hole to be equal to an external air pressure.

16. A method for preparing a display device, comprising:
attaching the heat dissipation film according to claim 4 to the side of the display module facing away from the display side, and aligning the reserved hole with a set region of the display module, wherein, after attaching the heat dissipation film to the display module, the cut-off line enables internal air pressure of the reserved hole to be equal to an external air pressure.

17. A method for preparing a display device, comprising:
attaching the heat dissipation film according to claim 5 to the side of the display module facing away from the display side, and aligning the reserved hole with a set region of the display module, wherein, after attaching the heat dissipation film to the display module, the cut-off line enables internal air pressure of the reserved hole to be equal to an external air pressure.

18. A method for preparing a display device, comprising:
attaching the heat dissipation film according to claim 6 to the side of the display module facing away from the display side, and aligning the reserved hole with a set region of the display module, wherein, after attaching the heat dissipation film to the display module, the cut-off line enables internal air pressure of the reserved hole to be equal to an external air pressure.

19. A method for preparing a display device, comprising:
attaching the heat dissipation film according to claim 7 to the side of the display module facing away from the display side, and aligning the reserved hole with a set region of the display module, wherein, after attaching the heat dissipation film to the display module, the cut-off line enables internal air pressure of the reserved hole to be equal to an external air pressure.

20. A method for preparing a display device, comprising:
attaching the heat dissipation film according to claim 8 to the side of the display module facing away from the display side, and aligning the reserved hole with a set region of the display module, wherein, after attaching the heat dissipation film to the display module, the cut-off line enables internal air pressure of the reserved hole to be equal to an external air pressure.

\* \* \* \* \*